United States Patent [19]
Ma et al.

[11] Patent Number: 5,651,176
[45] Date of Patent: Jul. 29, 1997

[54] VIBRATORY FEEDER TRAYS AND SYNCHRONOUS MASS PRODUCTION APPARATUS FOR CIRCUIT BOARD FABRICATION

[75] Inventors: Abraham C. Ma, San Jose; Hans Schiesser, Fremont; Paul Y. J. Hsueh, Concord, all of Calif.

[73] Assignee: MA Laboratories, Inc., San Jose, Calif.

[21] Appl. No.: 496,981

[22] Filed: Jun. 30, 1995

[51] Int. Cl.$^6$ ........................ H05K 3/34
[52] U.S. Cl. ................ 29/740; 29/759; 29/821; 29/823; 198/763
[58] Field of Search .................. 29/739, 740, 741, 29/743, 759, 821, DIG. 46, 823, 335; 198/763, 766, 769; 414/737, 224

[56] References Cited

U.S. PATENT DOCUMENTS

| | | | |
|---|---|---|---|
| Re. 33,780 | 12/1991 | Itagaki et al. | 29/741 |
| 4,768,647 | 9/1988 | Lehtola | 198/760 |
| 4,809,839 | 3/1989 | Elliott | 198/766 |
| 4,880,106 | 11/1989 | Falconer et al. | 198/763 |
| 4,952,109 | 8/1990 | Hendricks | 414/224 |
| 4,995,157 | 2/1991 | Hall | 29/740 |
| 5,116,185 | 5/1992 | Lofstedt | 414/415 |
| 5,153,983 | 10/1992 | Oyama | 29/740 |
| 5,154,316 | 10/1992 | Holcomb et al. | 221/202 |
| 5,155,903 | 10/1992 | Nakashima et al. | 29/740 X |
| 5,184,716 | 2/1993 | Gaines | 198/763 |
| 5,208,969 | 5/1993 | Hidese | 29/740 |
| 5,295,294 | 3/1994 | Ito | 29/740 |
| 5,329,692 | 7/1994 | Kashiwagi | 29/740 |
| 5,337,465 | 8/1994 | Tamaki et al. | 29/740 |
| 5,509,201 | 4/1996 | Ingwersen | 29/759 X |

FOREIGN PATENT DOCUMENTS 45-327289   12/1993   Japan ..................... 29/740

*Primary Examiner*—Peter Vo
*Assistant Examiner*—Khan Nguyen
*Attorney, Agent, or Firm*—Thomas Schneck

[57] ABSTRACT

A circuit board fabrication apparatus and method having a vibratory feeder tray is disclosed. The feeder tray is preferably of low mass and horizontally-disposed and has multiple grooves which closely fit electronic parts, and hollowed-out bottom portions, generally below the rails separating the grooves. The hollow portions significantly contribute to low mass. Almost 50% of the mass of the tray's top plate may be removed. The parts are picked up one at a time and placed at precise positions on circuit board substrates by the rotating nozzles of a pick-and-place turret. An electromagnetic coil operating below the grooves of the feeder tray smoothly and continuously advances the parts in the grooves to the region in which they are picked up by the nozzles. Additionally, a slider table supporting the vibratory feeder tray positions each groove of the feeder tray in turn at the uptake point of the turret. The feeder tray may be easily reloaded with parts while it is vibrating, thereby permitting the fabrication apparatus to run continuously for long periods. The vibratory feeder tray allows for quick delivery of the parts in a consistent orientation and, together with the slider table positioning capability and the action of the rotating turret, allows for high volume manufacture of circuit boards.

47 Claims, 6 Drawing Sheets

VIBRATORY FEEDER TRAYS AND SYNCHRONOUS MASS PRODUCTION APPARATUS FOR CIRCUIT BOARD FABRICATION

TECHNICAL FIELD

This invention relates to devices and methods for assembling circuit boards by picking up and placing electronic parts from parts feeders and onto circuit board substrates.

BACKGROUND ART

High volume fabrication of circuit boards, including memory modules, video/sound cards, and modem/fax cards requires rapid placement of numerous small electronic parts, such as chips, capacitors, resistors, and switches, onto circuit board substrates. Machines for circuit board manufacture generally include a means for feeding the appropriate parts to an arm. The arm lifts the individual parts and deposits them on the circuit board substrates, thus it may be known as a "pick-and-place" arm. Such machines also generally include a means for positioning the circuit board substrates beneath the arm so that the parts are correctly deposited, according to the necessary pattern of the particular circuit board. For example, see U.S. Pat. No. 5,153,983 to Oyama. A specific type of high speed pick-and-place machine that utilizes a rotating turret with a vacuum for uptake of parts and a forced air stream for their discharge is known as a "chip shooter," and is well adapted to mass production of circuit boards.

The usual method for feeding the parts to the arm is by using a tape reel. A tape, in this context, is a plastic or paper strip in which multiple cavities have been formed. The cavities are arranged in single file along the length of the strip, and an individual electronic part is placed in each cavity. The parts are then sealed with an adhesive tape covering that is affixed to the strip. The sealed tape is then wound into a large reel of parts. Parts are thus generally stored and supplied in this form, or they may need to be loaded into tape reels by the circuit board manufacturers at additional time and expense. In use, the tape reel must be repeatedly unwound and its covering peeled back to reveal the parts one by one for pick up by the arm. This means of feeding the parts is quite costly and time consuming as the tape materials are specialized and are used only once, the process of preparing the reels is very involved, requiring a special machine and a great amount of manpower, and the parts are usually loosely-placed in the cavities of the tape which necessitates correction of their orientations. Also, there is a significant time delay between presentation of one part to the arm for pick-up and the presentation of the next part. Thus, the parts are not quickly and efficiently picked up by the arm nor is their orientation assured.

Another method of feeding the parts is to use tube feeders. This entails plugging a plurality of tubes, each tube containing a row of a particular part, into the fabrication apparatus in a manner that allows a gravity or positive placement feed to place individual parts near the arm. When a tube is empty, it must be removed from the apparatus and replaced. This removal and replacement time causes an undesired delay in the manufacturing process. If the tubes have different quantities of parts, the apparatus needs to be stopped frequently for tube replacement. It is also difficult to see how many parts remain in the tube. In addition, the gravity feed of the tube feeders often results in a horizontal settlement time of the part before it may be picked up by the arm, which is short but significant for rapid, high volume manufacture. Simply put, tube feeders are not designed for mass production. U.S. Pat. No. 5,329,692 to Kashiwagi presents an electronic component mounting apparatus that utilizes both a tube feeder and a tape reel.

An object of the present invention is to provide a circuit board fabrication apparatus having a rapid, consistent, cost-effective, and reusable means of feeding parts in a correct orientation to an arm within the apparatus.

Another object is to provide an improved method for mass production of circuit boards, allowing longer running times of the circuit board fabrication apparatus.

DISCLOSURE OF THE INVENTION

The above objects have been achieved through a vibratory feeder tray in combination with a circuit board fabrication apparatus of the type having a pick-and-place turret and a movable stage for support of circuit board substrates. The vibratory feeder tray is preferably of low mass and horizontally-disposed. The feeder tray has a top plate with multiple grooves or lanes closely-fitting electronic parts and hollowed-out portions on its underside. The hollowed-out portions may have multiple levels, with the deepest level corresponding to the undersides of rails between the grooves and the shallowest level corresponding to the undersides of the grooves. Almost 50% of the feeder tray plate's mass may be removed by hollowing out such portions. Typically, between 30% to 50% of the mass of the plate is removed by hollowing.

Electronic parts are loaded into the grooves in a single-file manner in a consistent orientation and advanced in each lane through a vibratory means positioned at the underside of the top plate. Through a push-pull oscillation provided by an electromagnetic coil located in the vibratory means and operating on the bottom of the feeder tray, a small vibration occurs in a direction parallel to the grooves. This vibration causes the parts to move forward in the lanes to a stop region at the end of each lane, where they may be picked up individually. As each part is removed, it leaves a temporarily empty stop region which is quickly filled with the next part in the groove. More parts may be added to each groove as the vibration occurs, thus obviating frequent shutdown of the fabrication apparatus.

From the stop regions, the parts are individually picked up by a vacuum operating within the nozzles of a rotating pick-and-place turret. Each nozzle carries a part in a preserved orientation and rotates about the turret to a movable X-Y stage, which is loaded with circuit board substrates. At the correct placement location for the part, the vacuum in the nozzle is reversed to a forced air stream which "shoots" the part into place on the substrate. Continuous pick-up and placement by the many nozzles on the turret occurs along with continuous movement of the X-Y stage to position the correct spots for placement directly underneath the nozzles and with continuous advancement of the parts in the grooves of the feeder tray.

In the parts feeding assembly, the nozzles of the turret rotate in turn to a fixed uptake point. The vibratory feeder tray is preferably supported on a slider table and positioned, one lane at a time, so that the stop region of the lane is below a nozzle at the fixed uptake point. The speed of the feeder tray's vibration is set so that the parts smoothly and continuously advance to fill the stop regions. If the vibration is too great, the parts tend to spring out of the grooves. The speed of the alignment by the slider table and the speed of movement of the parts within the grooves is preferably set so that the particular stop region that is to be aligned with the fixed uptake point contains a part at the time of its alignment with the uptake point. The rotating of the turret is preferably also optimized to allow for synchronous meeting of a nozzle with a stop region containing a part at the uptake point, thus avoiding any delay in pick-up of the parts. A large number of lanes in the feeder tray and a large number of nozzles on the turret contribute to rapid feeding of parts to the circuit board substrates and compensate for any slowness that may occur in the advancement of parts within the grooves.

Because circuit boards are generally assembled at high speeds and in large volumes, every improvement in the efficiency of fabrication leads to higher production. The present invention is an important improvement in circuit board fabrication efficiency because the low mass, horizontally-disposed vibratory feeder tray allows relatively minor vibrations to quickly and smoothly deliver the needed parts. The use of the vibratory feeder tray of the present invention also allows for synchronous mass production and thus the reduction of delays in circuit board fabrication.

BEST MODE OF CARRYING OUT THE INVENTION

Figure 1:
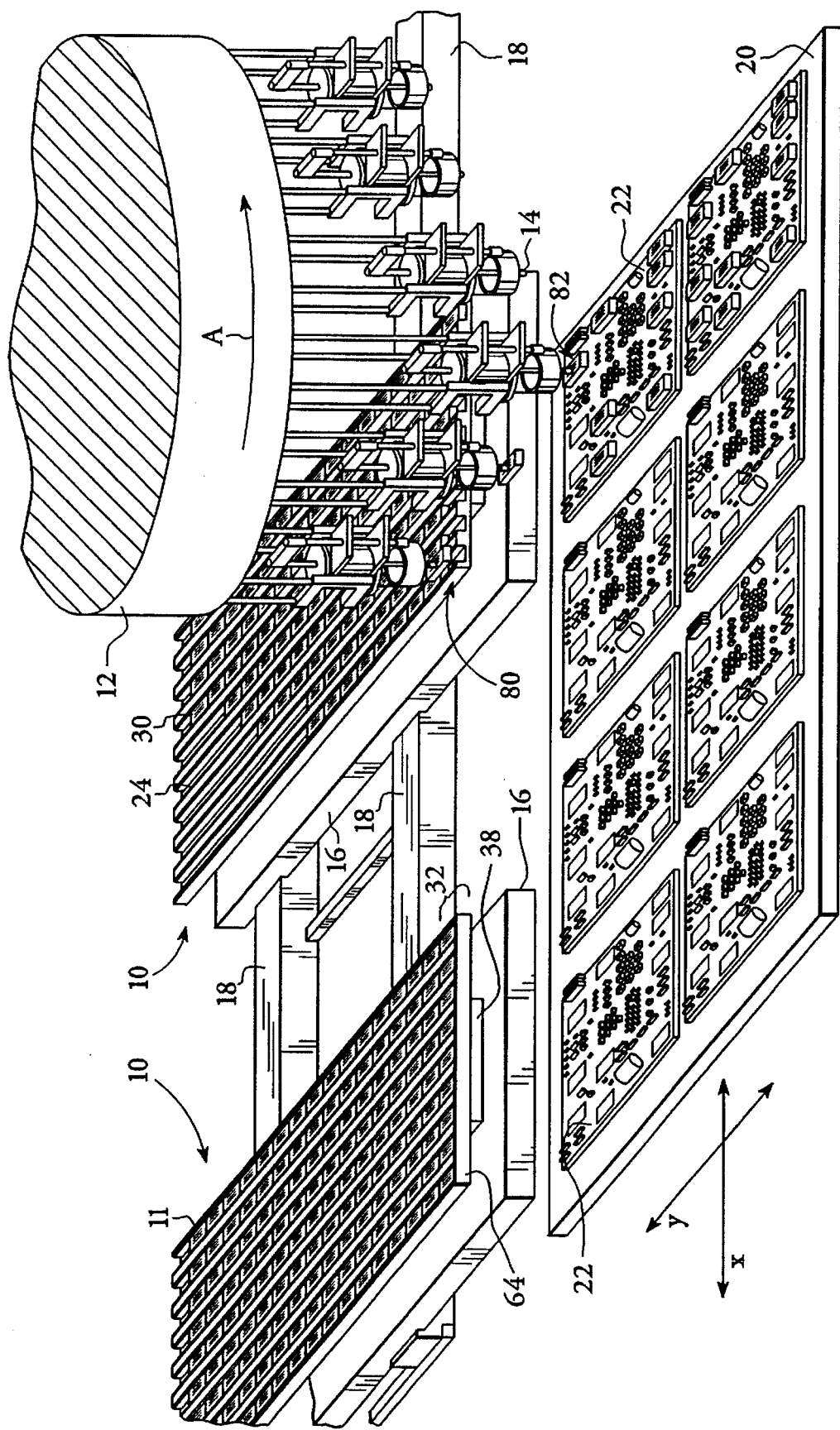
FIG. 1 illustrates a circuit board fabrication apparatus having vibratory feeder trays, according to the present invention.

With reference to FIG. 1, two low mass, horizontally-disposed vibratory feeder trays 10 are shown. Each feeder tray 10 has a plurality of grooves or lanes 24, more easily visible in FIG. 3. The grooves 24 are filled with electronic parts 30, such as chips, which are to be mounted on circuit board substrates 22. Substrate 22 is typically a board printed with wires upon which various electronic parts such as chips, switches, capacitors, and resistors are mounted.

In operation, feeder tray 10 vibrates and advances the parts within its lanes to stop regions 32 which are at one end of each groove of feeder tray 10. From stop region 32, each part is picked up individually by a nozzle 14 of a pick-and-place turret 12. The nozzle operates to pick up a part by using a vacuum and to place a part by using a forced air stream to "shoot" the part into place on substrate 22. Once the part is picked up by nozzle 14, it is rotated about pick-and-place turret 12, e.g. in direction A, and is placed at the correct location on circuit board substrate 22. According to the preferred embodiment, the nozzles rotate to a fixed uptake point 80 to pick up the parts and then to a fixed discharge point 82 to drop off the parts. The nozzles of turret 12 may be set, e.g. via a processor, to pick up parts one at a time from adjacent grooves and then to repeat the cycle. In the same manner, the nozzles may be set to pick up according to some other desired pattern, or to correct for an empty lane by skipping it during one cycle. The substrates 22 are supported by a movable X-Y stage 20. X-Y stage 20 operates in two directions, along the X- and the Y-axes, shown in FIG. 1, to position the correct spot on the correct substrate under the nozzle at fixed discharge point 82 for placement of a particular part. The fabrication apparatus may also have an optical system that checks the orientation of the picked up part, in order to minimize errors.

FIG. 1 also shows slider tables 16. Each slider table is shown supporting a feeder tray 10. The slider tables 16 move along track 18 in a direction along the X-axis. The slider tables may be moved along the track by a belt and pulley system. A slider table 16 supporting a feeder tray 10 that is filled with electronic parts 30 is slid into position near pick-and-place turret 12, so that the nozzles 14 may reach the parts in the stop regions 32. The slider table of the present invention is preferably utilized for specific positioning of the supported vibratory feeder tray so that each lane of the feeder tray is advanced one by one below turret 12 and the stop region 32 of the particular lane is aligned with the fixed uptake point 80 of turret 12. After a part has been removed in sequence from each lane, slider table 16 shifts back to the first lane to repeat the cycle. The slider table alignment is preferably governed by a processor which accounts for any variation in groove and rail widths of the supported feeder tray and the specific turret design.

The feeder tray 10 continuously vibrates to advance parts to stop regions 32 of each lane. Parts are picked up until feeder tray 10 is emptied. Then, the empty feeder tray 10 supported on slider table 16 moves along track 18 away from pick-and-place turret 12. While a feeder tray 10 is positioned away from turret 12, it may be easily loaded with more parts. While in the remote position, the feeder tray is generally filled to capacity with parts, which contributes to longer running times for the apparatus. Multiple slider tables 16 may be used, e.g. each supporting one or more feeder trays 10 that are designed to fit unique electronic parts. Slider tables 16 may be moved along track 18 to turret 12 from either side of turret 12, i.e. if turret 12 is the zero point, the slider tables 16 may approach turret 12 from either the positive or negative X-direction.

Figure 2:
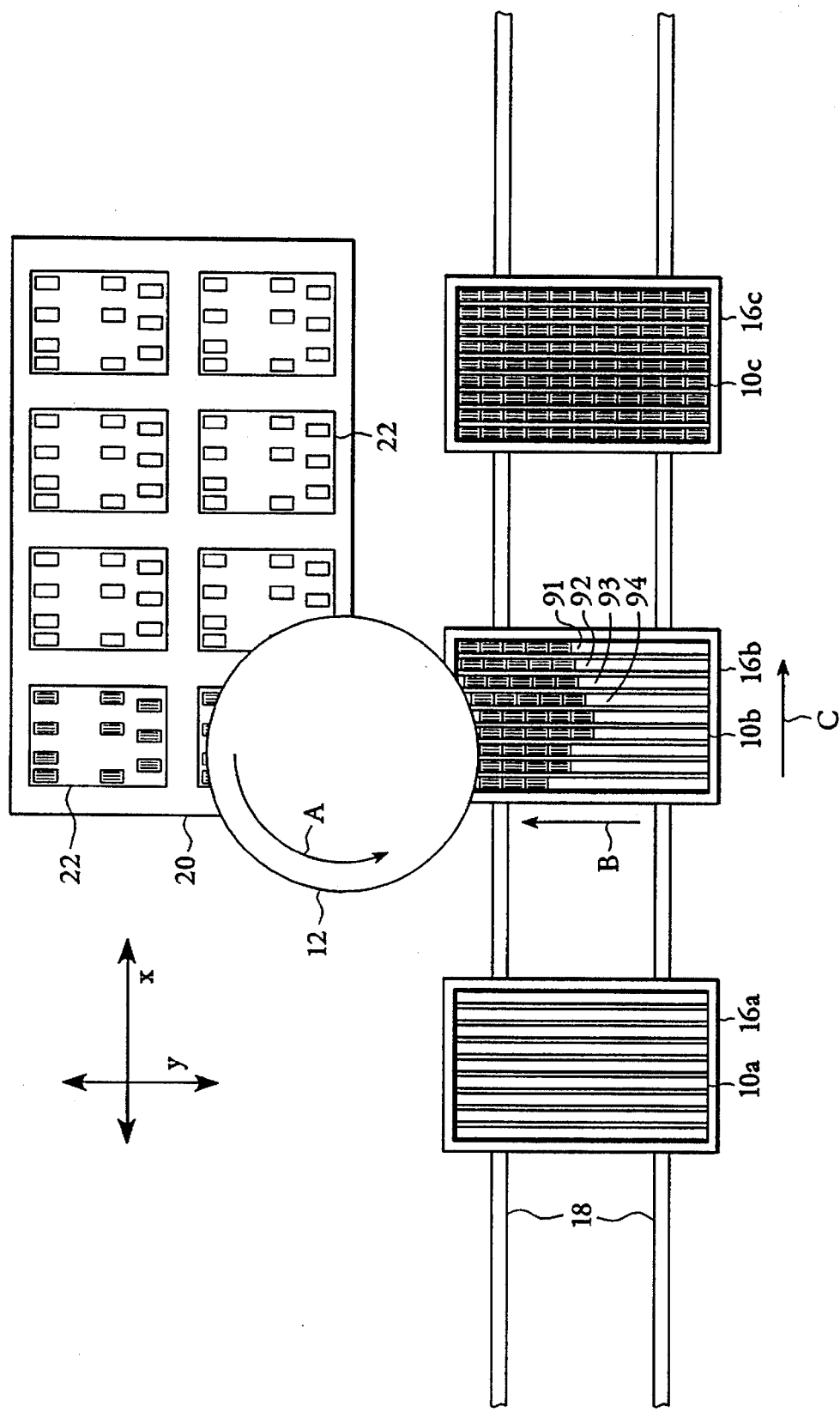
FIG. 2 is a top view of a circuit board fabrication apparatus having vibratory feeder trays, according to the present invention.

FIG. 2 illustrates the circuit board fabrication assembly from a top view. Thus, the turret 12 may rotate in direction A while the parts are advanced in the lanes of feeder tray 10b in direction B. Meanwhile, a slider table 16b may advance feeder tray 10b one lane at a time, i.e. lane 91 followed by lane 92, then lane 93, etc., generally in direction C, to a fixed uptake point 80 of turret 12. When the slider table 16b has advanced each of the grooves one-by-one through the uptake point, it may shift feeder tray 10b back again to the first groove, lane 91, and then continue in direction C. As stated above, the alignment of grooves with the turret may be effected according to any other advantageous patterned sequence.

Figure 3:
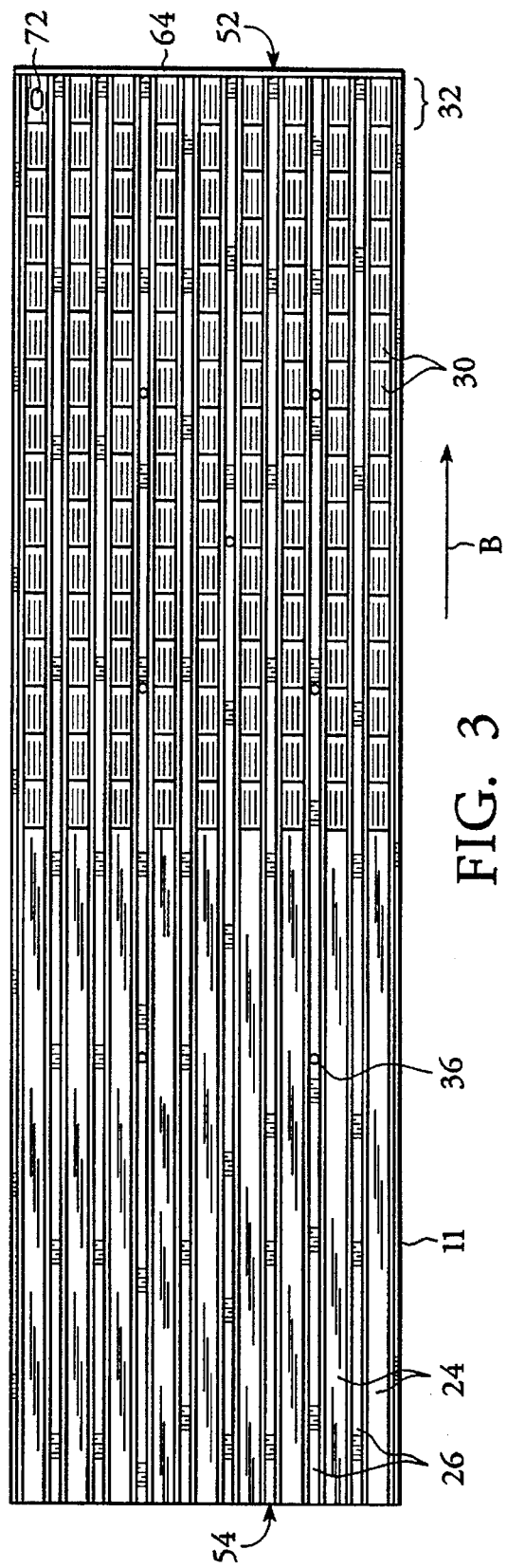
FIG. 3 is a top view of a vibratory feeder tray of the present invention.

With reference to FIG. 3, a top view of feeder tray 10 shows parallel grooves 24 alternating with parallel rails 26. Full-sized rails may occupy the outermost positions of feeder tray 10 or positioning of the grooves on the outer portions may be desired. This would allow the outer grooves to each have one thin sidewall. The grooves 24 are shown partially filled with electronic parts 30, as they would be during operation. Parts 30 are advanced along grooves 24 in direction B to the stop regions 32, where they are removed by the nozzles 14 of FIG. 1. Grooves 24 are cut to precisely fit parts 30, and therefore provide rapid advancement of parts with no wasted motion and allow consistent orientation of the parts. The grooves of the trays are typically quite long and hold a large capacity of parts, further contributing to long run times. Apertures 72, visible in FIGS. 3 and 4, may be provided in each groove at the center of the stop region 32. This allows for pressure equalization and easy pick-up via vacuum in the nozzle.

Figure 4:
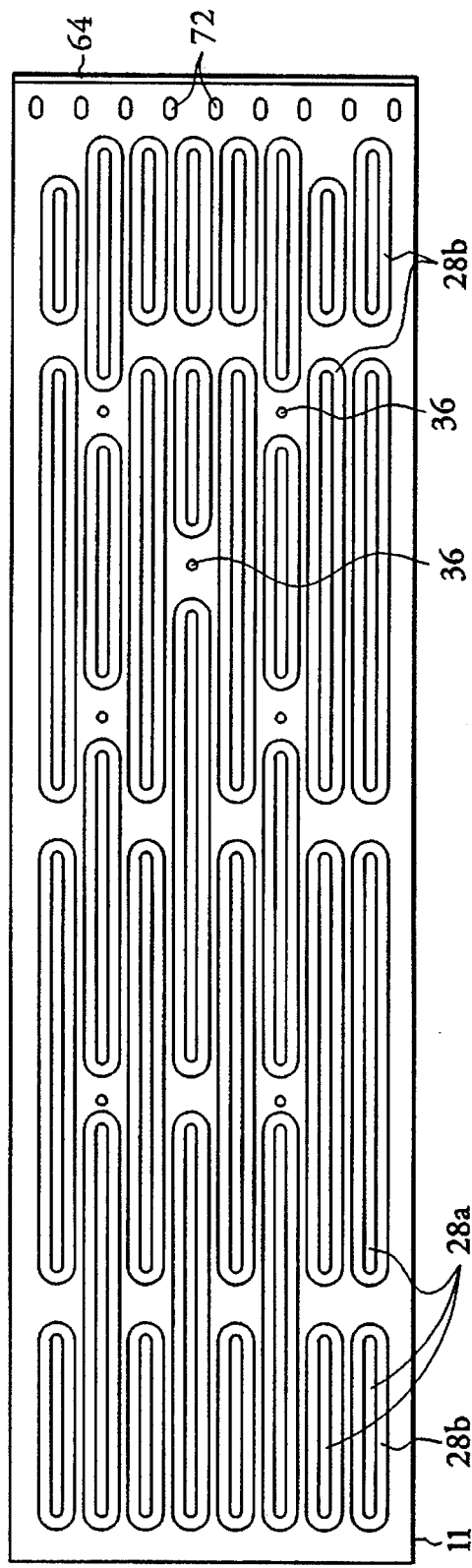
FIG. 4 is a bottom view of a feeder tray plate of the present invention.

FIG. 4 shows the underside of the feeder tray top plate, with multiple hollowed-out portions 28a, 28b. The deepest levels 28a of the hollowed-out portions correspond generally to the undersides of rails 26, so that the parts 30 move along lanes that are defined between substantially hollow rails in the vibratory feeder tray of the present invention. The shallowest levels 28b of the hollowed-out portions correspond generally to the undersides of the grooves. The pattern of hollowed-out portions 28a, 28b is governed by overall design considerations of feeder tray 10 such as positioning of holes 36.

Figure 5:
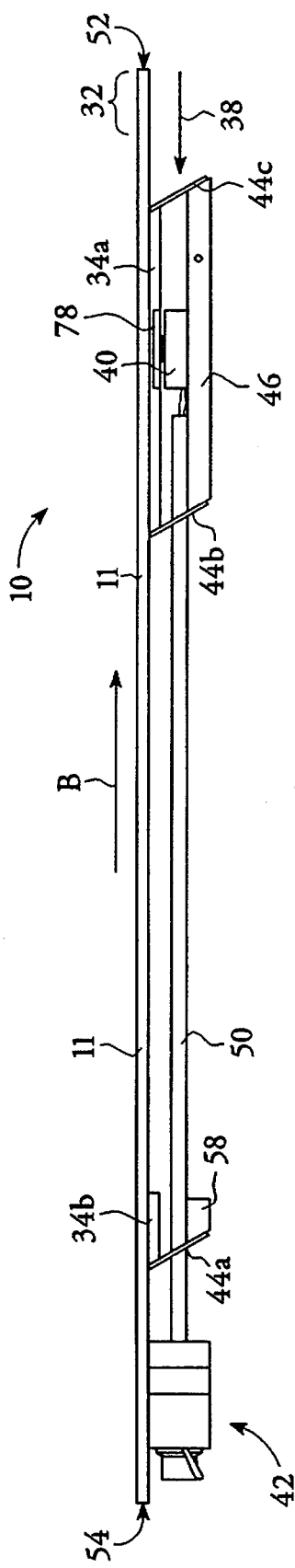
FIG. 5 is an elevation view of a feeder tray plate and a vibratory means of the present invention.

Hollowed-out portions 28a, 28b contribute greatly to the reduction of the overall mass of feeder tray 10. From 30% to 50% of the mass of the top plate may be removed in this way. Such a reduction in mass allows the trays to be moved rapidly, with low inertia. Such rapid movement is significant because accurate tray positioning and repositioning is critical. The top plate 11 of the feeder tray 10, more easily visible in FIG. 5, is preferably machined out of aluminum and then nickel-plated, which provides light weight and high durability. The low mass of feeder tray 10 also allows minor vibrations to smoothly and rapidly advance the part in the grooves. The normal mass of shaking feeders used in various manufacturing industries is too large for the quick feeding of parts desired here.

Figure 7:
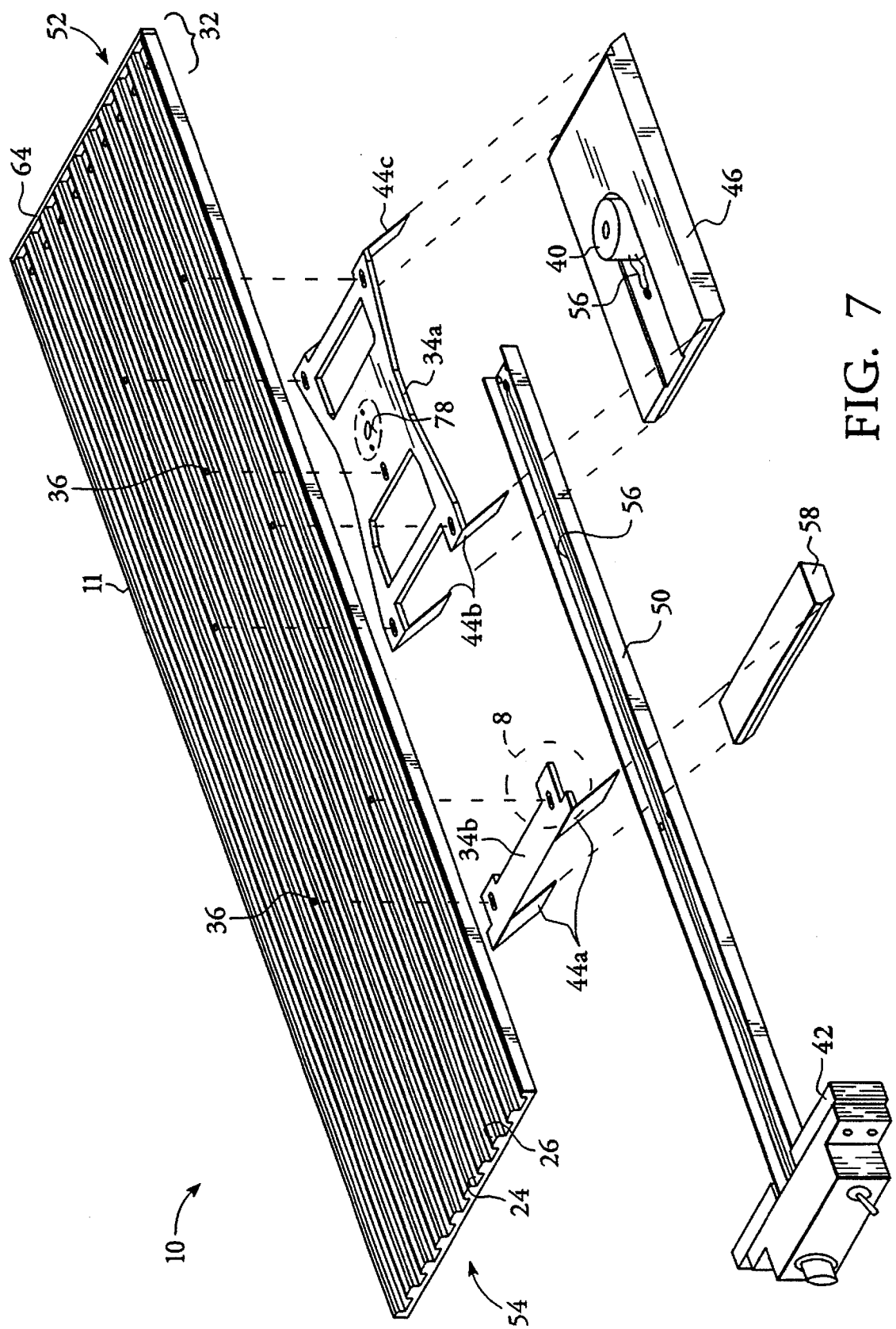
FIG. 7 is an exploded view of a vibratory feeder tray of the present invention.

In FIG. 5, the vibratory feeder tray 10 is shown to comprise top plate 11 and vibratory means 38. Vibratory means 38 includes an electromagnetic coil 40 and an electronic controller with potentiometer 42. Additionally, more electromagnetic coils may be desired and their mounting angles may be varied, depending on the vibration requirements of the apparatus. Vibratory means 38 also includes a plurality of spring plates 44a–44c. The spring plates 44a–44c support top plate 11 of feeder tray 10 and are mounted at an angle, slanted toward the back end 54 of top plate 11, i.e. away from stop regions 32. Spring plates 44a–44c are shown in FIG. 7 as each comprising two spaced-apart halves. This may be desired to further reduce the mass of feeder tray 10.

Figure 9:
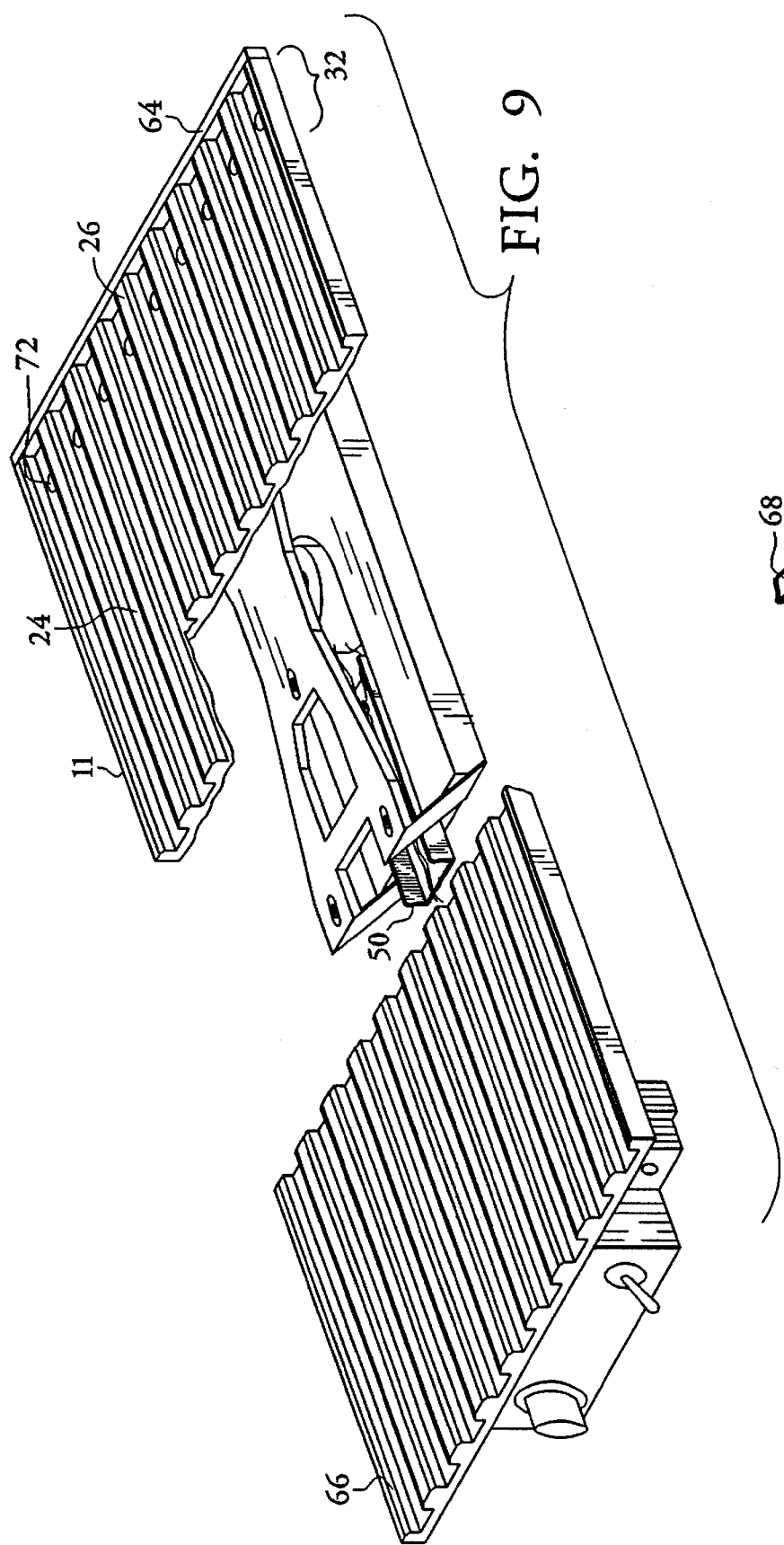
FIG. 9 is a segmented view of an assembled vibratory feeder tray of the present invention.

Contact plate 34a, 34b, seen in FIGS. 5 and 7, and made preferably of aluminum, is attached to the underside of top plate 11. Contact plate 34a has a round steel plate or armature 78 attached to it, and preferably embedded into its underside, in the area directly above coil 40. The vibratory means 38 is mounted below top plate 11 and contact plate 34a so that coil 40 is disposed beneath contact plate 34a and proximate to the front end 52 of top plate 11, i.e. the end having stop regions 32. The controller with potentiometer 42 is positioned proximate to the back end 54 of top plate 11. Coil 40 is supported by coil base 46, which may also serve to support some of the spring plates 44a–44c, as in spring plates 44b, 44c, which are shown connected to contact plate 34a, in the FIG. 7 embodiment. Coil base 46 is mechanically connected to controller with potentiometer 42 by base extension 50, and coil 40 is operatively connected to controller with potentiometer 42 by wires 56. The spring plates 44a–44c and base extension 50 are disposed in a direction parallel to grooves 24 of top plate 11. In FIGS. 5 and 7, a spring plate 44a is disposed along base extension 50 near back end 54. Spring plate 44a is supported by spring plate base 58, which is mechanically connected to base extension 50. In FIG. 7, spring plate 44a is also connected to contact plate 34b. There is no required number of spring plates 44a–44c in feeder tray 10 of the present invention. Rather, the number and position of spring plates is chosen according to support considerations. FIG. 9 shows vibratory feeder tray 10 in an assembled but segmented form.

Figure 6:
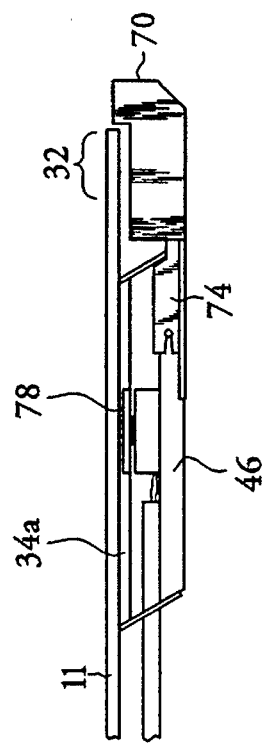
FIG. 6 is an elevation view of a catch basin of the present invention, attached to the vibratory feeder tray.

During operation of feeder tray 10, an alternating current is supplied to coil 40. Coil 40 operates on contact plate 34a with attached armature 78 in a pushing and pulling manner. At 60 cycles per second, the result is a vibration transmitted to top plate 11. During the pull phase of coil 40, spring plates 44a–44c are bent further. During the push phase of coil 40, the spring plates are released. The energy stored in spring plates 44a–44c, along with coil 40's push force, lead to an upward and forward movement of top plate 11. This upward and forward movement imposed upon top plate 11 is greater than the downward and backward movement. Therefore, parts 30 travel in one direction in the grooves 24, namely in direction B toward the stop regions 32. End stop 64, shown in FIG. 3 adjacent to stop regions 32, is desired to prevent the parts from falling out of the grooves and to precisely locate the center of the part for quick and consistent pick-up in the correct orientation. Controller with potentiometer 42 governs the amplitude of the vibration. A removable catch basin 70, seen in FIG. 6, is preferably positioned below top plate 11 proximate to the stop regions 32, to catch any parts that may have climbed over end stop 64 or parts which are damaged, as determined by a visual system of the apparatus, for example. A similar catch basin may be mounted elsewhere in the rotating path of the nozzles. Depending on the quantity and weight of the electronic parts to be advanced in feeder tray 10, controller with potentiometer 42 may be adjusted so that the parts 30 move along the lanes 24 in a smooth manner. The horizontally-disposed plate 11 of vibratory feeder tray 10 eliminates the horizontal settling time of parts that occurs with the gravity feed mechanisms of tube feeders.

The multiple grooves of the vibratory feeder tray 10 along with the circuit board fabrication apparatus having a pick-and-place turret 12 is a highly effective combination. For any given lane, there is a time delay between the pick up of a part and the advancement of the next part to the stop region. By using a pick-and-place turret having multiple nozzles with each nozzle picking up an individual part in turn, a compensation is made for the time delay in the advancement of parts in the feeder tray. There is a delay in the time between pick-ups from a given lane because of the path of the rotating nozzles, in other words, which adjusts for any delay in parts advancement in that given lane. For example, it may take 2 seconds for a stop region of a particular groove to be filled smoothly and completely via vibration of feeder tray 10. If pick-up were to occur continuously from one groove, there would be a top speed of 2 seconds between placement of parts. The mobilization of feeder tray 10 via slider table 16 in combination with the rotation of turret 12, however, eliminates the wait for a lane to be filled. A pick-and-place speed of 0.15 second or faster can be achieved with this combination. For a turret having 16 nozzles and a feeder tray with 16 lanes, this translates to 2.4 seconds to pick up parts from the first through the sixteenth lanes, which allows enough time for the stop region of the first lane to be refilled by the time it is realigned with fixed uptake point 80. The movements of slider table 16 and turret 12 should be synchronized for maximum efficiency. Generally speaking, it is advantageous to have many grooves in the feeder tray, so that the pick-up regions of the grooves are more likely to be filled with parts during any given pass of a particular nozzle.

Figure 8:
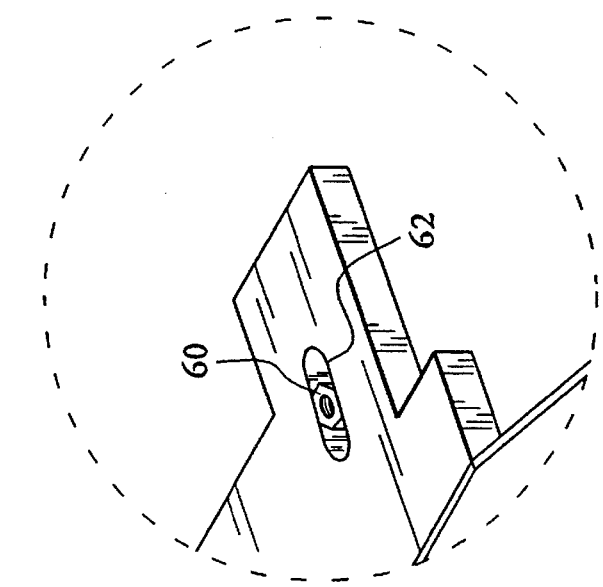
FIG. 8 is an enlarged view of a portion of FIG. 7, showing the adjustable connections between a feeder tray plate and a vibratory means, according to the present invention.

The width and depth of the grooves in feeder tray 10 are governed by the size of the particular electronic parts, i.e. the grooves should closely fit the particular parts. Similarly, the specific dimensions of top plate 11 are governed by the particular parts, i.e. the most efficient number of lanes for pick-up and placement of those parts and the most efficient length of the lanes is determined by the desired rate at which the parts are to be fed in feeder tray 10 to the circuit board fabrication apparatus. The distances between the grooves are governed by the slider table alignment locations, along with the turret and nozzle designs. Thus, FIG. 8, which is an enlarged view of a portion of FIG. 7, shows slots 62 and nuts 60 to adjustably affix any size top plate through holes 36 to vibratory means 38 and to locate the top plate and end stop according to the center of the part it will hold. Top plates with grooves of varying sizes, to simultaneously feed varying parts, may also be desired.

The circuit board fabrication apparatus may employ many vibratory feeder trays, each tray machined to fit the same or different parts. If desired, the fabrication apparatus may additionally employ other known means for the feeding of certain parts, so that part $\alpha$ is fed via a vibratory feeder tray and part $\beta$ is fed to turret 12 in some other manner.

Figure 10:
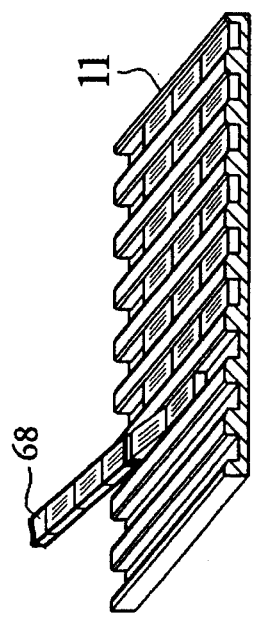
FIG. 10 illustrates the loading of parts into a vibratory feeder tray, according to the present invention.

The vibratory feeder tray 10 may be loaded and reloaded quickly and conveniently during vibration so that the feeding operation to pick-and-place turret 12 is continuous. In addition, slider tables 16 may be utilized to move feeder trays containing the appropriate parts to the vicinity of turret 12, while feeder trays away from turret 12 are loaded with parts. The angled edges 66 of lanes 24 at the top edges of the grooves of top plate 11 are shown most clearly in FIG. 9. These angled edges are preferably within the range of 40° to 50° relative to horizontal and allow for very easy loading of the parts. Typically, parts are supplied in narrow tubes 68, seen in FIG. 10. Within these tubes, the parts are single-file and in a consistent orientation. The operator simply inserts the open portion of a tube partially into a groove of top plate 11 of feeder tray 10, preferably from a slightly upward and rearward angle, and then moves the tube first forward and then rapidly switching to rearward. The forward momentum of pushing the tube into the groove and then pulling it rearward, together with the gravitational pull on the parts themselves fills the groove with parts in a rapid and exact manner.

The circuit board fabrication apparatus of the present invention represents a significant advance over the prior art. Unlike tube feeders wherein the parts are fed slowly and the pick-up of parts stops when a tube is empty, the multiple grooves and easy loading capability of vibratory feeder 10 eliminate this wasteful delay, which is an important consideration in high volume circuit board fabrication. Additionally, the use of vibratory feeder tray 10 is a great improvement over the use of the tape reel method of feeding parts. The time and cost of first assembling the parts into the tape reels and then of unwinding the tape reels, removing the covering layer, and the high degree of straightening out as the parts are lifted are absent from the present invention. Because the grooves of feeder tray 10 are designed to closely-fit each part, the orientation of the picked-up parts is not compromised. Currently, tape reels allow a maximum substrate placement rate of approximately 14,000 parts/hour. The present invention increases this rate to 24,000 parts/hour. Thus, the present invention provides an important improvement in the mass production of circuit boards.

We claim:

1. A circuit board fabrication apparatus comprising:
    a vibratory feeder tray having multiple grooves for closely-fitting electronic parts to be set on circuit board substrates and a stop region at an end of each of the grooves, the parts advancing within the grooves through vibration of the tray to fill the stop regions,
    means for picking up parts from the stop regions of the tray, and
    means for transferring picked-up parts to the circuit board substrates,
    means for placing picked-up parts onto the circuit board substrates,
    the vibratory feeder further having a top plate housing the grooves on a top side thereof, the top plate having hollowed-out portions on a bottom side thereof,
    the hollowed-out portions of the top plate having at least two levels of depth, the deepest level corresponding to undersides of rails between the grooves and the shallowest level corresponding to undersides of the grooves.

2. The apparatus of claim 1 wherein the vibratory feeder tray further comprises:
    an electromagnetic coil, and
    a plurality of slanted spring plates, the coil and the spring plates operating to vibrate the top plate via a steel contact plate attached to the bottom side of the top plate and disposed proximate to the coil, when the coil is supplied with an alternating current.

3. The apparatus of claim 2 wherein the hollowed-out portions of the top plate account for removal of between 30% and 50% of the mass of the top plate.

4. The apparatus of claim 2 wherein the vibratory feeder tray further comprises an end stop attached to the top plate at the ends of the grooves proximate to the stop regions.

5. The apparatus of claim 2 wherein the vibratory feeder tray includes multiple apertures through the top plate, each aperture disposed in one of the grooves at its stop region.

6. The apparatus of claim 2 wherein the vibratory feeder tray further comprises:
    a catch basin positioned below the top plate at the ends of the grooves proximate to the stop regions.

7. The apparatus of claim 1 wherein the grooves of the feeder tray are angled at top edges of each of the grooves for loading of the parts.

8. The apparatus of claim 7 wherein the top edges are angled in the range of 40° to 50° relative to the bottom of each of the grooves.

9. The apparatus of claim 1 further comprising:
    means for aligning the stop regions one at a time with the means for picking up parts.

10. The apparatus of claim 9 further comprising:
    means for timing the filling with parts of the stop regions with the picking up of parts from the stop regions so that any one stop region is filled when it is aligned with the means for picking up parts.

11. The apparatus of claim 9 wherein the means for aligning the stop regions comprises a slider table supporting the vibratory feeder tray and slidably positioning the supported vibratory feeder tray so that the stop regions are aligned in a patterned sequence with the means for picking up parts.

12. The apparatus of claim 1 wherein the means for picking up parts and the means for placing picked-up parts comprises a turret having a series of nozzles, each nozzle alternately providing a vacuum to pick up one of the parts and a forced air stream to place the picked-up part, the turret rotating between the stop regions of the vibratory feeder tray and the circuit board substrates.

13. The apparatus of claim 12 wherein the means for placing picked-up parts further comprises a movable stage supporting the circuit board substrates, the movable stage guiding the circuit board substrates below the nozzles of the turret for placement of the picked-up parts.

14. A circuit board fabrication apparatus comprising:
a moving stage to support and carry a circuit board;
a plate having multiple grooves for closely-fitting electronic parts to be set on the circuit board and a stop region at an end of each of the grooves, the plate further having multiple-level hollowed-out bottom portions;
vibratory means operably connected to the plate, thereby causing advancement of the parts in the grooves toward the stop regions; and
a rotating pick-and-place turret disposed proximate to the moving stage and to the stop regions of the plate;
whereby the turret rotates to pick up a part near the stop region of the plate, rotates to position the picked up part over the circuit board, and places the part onto the circuit board.

15. The fabrication apparatus of claim 14 wherein the plate has hollowed-out bottom portions, the hollowed-out portions accounting for removal of between 30% and 50% of the mass of the plate.

16. The fabrication apparatus of claim 14 wherein the deepest level of the hollowed-out bottom portions corresponds to undersides of rails between the grooves.

17. The fabrication apparatus of claim 14 wherein the shallowest level of the hollowed-out bottom portions corresponds to undersides of the grooves.

18. The fabrication apparatus of claim 14 further comprising an end stop attached to the plate at the ends of the grooves proximate to the stop regions.

19. The fabrication apparatus of claim 14 wherein the plate defines an aperture in the stop region of each of the grooves.

20. The fabrication apparatus of claim 14 further comprising:
a catch basin positioned below the plate at the ends of the grooves proximate to the stop regions.

21. The fabrication apparatus of claim 14 wherein the grooves of the plate are angled at top edges of each of the grooves for loading of the parts.

22. The fabrication apparatus of claim 21 wherein the top edges are angled in the range of 40° to 50° relative to the bottom of each of the grooves.

23. The fabrication apparatus of claim 14 wherein the vibratory means further comprises:
an electromagnetic coil, and
a plurality of slanted spring plates, the coil and the spring plates operating to vibrate the plate and cause advancement of the parts in the grooves in a direction toward the stop regions when the coil is supplied with an alternating current.

24. A circuit board fabrication apparatus comprising:
a vibratory feeder tray having multiple grooves for closely-fitting electronic parts to be set on circuit board substrates and a stop region at an end of each of the grooves, the parts advancing within the grooves through vibration of the tray to fill the stop regions,
means for picking up parts from the stop regions of the tray,
means for transferring picked-up parts to the circuit board substrates,
means for placing picked-up parts onto the circuit board substrates, and
means for aligning each stop region with the means for picking up parts, the means for aligning including a slider table for supporting the tray and means for displacing the slider table to position each stop region in the tray sufficiently close to the means for picking up parts in order to pick up a part disposed in the stop region.

25. The apparatus of claim 24 wherein the vibratory feeder tray further comprises:
a top plate housing the grooves on a top side of the top plate and having hollowed-out portions on a bottom side of the top plate,
an electromagnetic coil, and
a plurality of slanted spring plates, the coil and the spring plates operating to vibrate the top plate via a steel contact plate attached to the bottom side of the top plate and disposed proximate to the coil, when the coil is supplied with an alternating current.

26. The apparatus of claim 25 wherein the hollowed-out portions of the top plate account for removal of between 30% and 50% of the mass of the top plate.

27. The apparatus of claim 25 wherein the hollowed-out portions of the top plate comprise at least two levels of depth, the deepest level corresponding to undersides of rails between the grooves and the shallowest level corresponding to undersides of the grooves.

28. The apparatus of claim 25 wherein the vibratory feeder tray further comprises an end stop attached to the top plate at the ends of the grooves proximate to the stop regions.

29. The apparatus of claim 25 wherein the vibratory feeder tray includes multiple apertures through the top plate, each aperture disposed in one of the grooves at its stop region.

30. The apparatus of claim 25 wherein the vibratory feeder tray further comprises:
a catch basin positioned below the top plate at the ends of the grooves proximate to the stop regions.

31. The apparatus of claim 24 wherein the grooves of the feeder tray are angled at top edges of each of the grooves for loading of the parts.

32. The apparatus of claim 31 wherein the top edges are angled in the range of 40° to 50° relative to the bottom of each of the grooves.

33. The apparatus of claim 24 further comprising:
means for timing the filling with parts of the stop regions with the picking up of parts from the stop regions so that any one stop region is filled when it is aligned with the means for picking up parts.

34. The apparatus of claim 24 wherein the means for picking up parts and the means for placing picked-up parts comprises a turret having a series of nozzles, each nozzle alternately providing a vacuum to pick up one of the parts and a forced air stream to place the picked-up part, the turret rotating between the stop regions of the vibratory feeder tray and the circuit board substrates.

35. The apparatus of claim 34 wherein the means for placing picked-up parts further comprises a movable stage supporting the circuit board substrates, the movable stage guiding the circuit board substrates below the nozzles of the turret for placement of the picked-up parts.

36. A circuit board fabrication apparatus comprising:

a moving stage to support and carry a circuit board;

a plate having multiple grooves for closely-fitting electronic parts to be set on the circuit board and a stop region at an end of each of the grooves;

vibratory means operably connected to the plate, thereby causing advancement of the parts in the grooves toward the stop regions;

a rotating pick-and-place turret disposed proximate to the moving stage; and a slider table for supporting the plate, the slider table having a slidable mounting to allow positioning of each stop region of the plate proximate the turret.

37. The fabrication apparatus of claim 36 wherein the plate has hollowed-out bottom portions, the hollowed-out portions accounting for removal of between 30% and 50% of the mass of the plate.

38. The fabrication apparatus of claim 36 wherein the plate has multiple-level hollowed-out bottom portions.

39. The fabrication apparatus of claim 38 wherein the deepest level of the hollowed-out bottom portions corresponds to undersides of rails between the grooves.

40. The fabrication apparatus of claim 38 wherein the shallowest level of the hollowed-out bottom portions corresponds to undersides of the grooves.

41. The fabrication apparatus of claim 36 further comprising an end stop attached to the plate at the ends of the grooves proximate to the stop regions.

42. The fabrication apparatus of claim 36 wherein the plate defines an aperture in the stop region of each of the grooves.

43. The fabrication apparatus of claim 36 further comprising:

a catch basin positioned below the plate at the ends of the grooves proximate to the stop regions.

44. The fabrication apparatus of claim 36 wherein the grooves of the plate are angled at top edges of each of the grooves for loading of the parts.

45. The fabrication apparatus of claim 44 wherein the top edges are angled in the range of 40° to 50° relative to the bottom of each of the grooves.

46. The fabrication apparatus of claim 36 wherein the vibratory means further comprises:

an electromagnetic coil, and a plurality of slanted spring plates, the coil and the spring plates operating to vibrate the plate and cause advancement of the parts in the grooves in a direction toward the stop regions when the coil is supplied with an alternating current.

47. The fabrication apparatus of claim 36 further including a second plate, a second vibratory means operably coupled to the second plate, and a second slider table for supporting and positioning the second plate; whereby the second plate is positioned in place of the plate when the plate becomes empty.

* * * * *